(12) United States Patent
Gerten et al.

(10) Patent No.: US 11,496,177 B2
(45) Date of Patent: Nov. 8, 2022

(54) AGILE NAVIGATION TRANSMITTER SYSTEM THAT INCLUDES A SINGLE AMPLIFIER SYSTEM

(71) Applicant: KBR Wyle Services, LLC, Houston, TX (US)

(72) Inventors: Gregory William Gerten, Marysville, OH (US); Gary Louis Green, Vandalia, OH (US); Rachel Eunice Reed, Dayton, OH (US); Jared T. Emerson, Columbus, OH (US); Sean Joseph Stasiak, Bel Air, MD (US); Steven John Billman, Riverside, OH (US)

(73) Assignee: KBR Wyle Services, LLC, Houston, TX (US)

( * ) Notice: Subject to any disclaimer, the term of this patent is extended or adjusted under 35 U.S.C. 154(b) by 7 days.

(21) Appl. No.: 16/917,445

(22) Filed: Jun. 30, 2020

(65) Prior Publication Data

US 2021/0006281 A1    Jan. 7, 2021

Related U.S. Application Data

(60) Provisional application No. 62/869,841, filed on Jul. 2, 2019.

(51) Int. Cl.
*H04B 1/403*    (2015.01)
*H04B 1/18*    (2006.01)
(Continued)

(52) U.S. Cl.
CPC ......... *H04B 1/406* (2013.01); *G06F 16/9017* (2019.01); *H03D 7/163* (2013.01);
(Continued)

(58) Field of Classification Search
CPC .......... H04B 1/406; H04B 1/001; H04B 1/18; H04B 1/28; H04B 17/318;
(Continued)

(56) References Cited

U.S. PATENT DOCUMENTS 5,867,535 A    2/1999  Phillips et al.
5,909,193 A    6/1999  Phillips et al.
(Continued)

FOREIGN PATENT DOCUMENTS

WO    WO-2021205272 A1 * 10/2021

*Primary Examiner* — Lana N Le
(74) *Attorney, Agent, or Firm* — Knobbe Martens Olson & Bear, LLP

(57) ABSTRACT

A method and transmission system for amplifying and providing navigation signals. The system comprises a splitter circuit configured to receive a plurality of radio frequency (RF) signals oscillating at at least two different frequencies $f_1$ and $f_2$. The splitter circuit is further configured to split and forward the RF signals having the $f_1$ frequency to a first bandpass filter and the RF signals having the $f_2$ frequency to a second bandpass filter. The system further comprises a first tunable amplifier configured to receive the RF signals from the first bandpass filter. The system further comprises a second tunable amplifier configured to receive the RF signals from the second bandpass filter at substantially the same time as the first tunable amplifier's receipt of the RF signals from the first bandpass filter. The first tunable amplifier is further configured to amplify its RF signals across a first band centered around the frequency $f_1$. The second tunable amplifier is further configured to amplify its RF signals across a second band centered around the frequency $f_2$. The amplified RF signals are fed substantially concurrently into a mixer circuit for transmission via an RF antenna to a navigation receiver.

19 Claims, 11 Drawing Sheets

(51) Int. Cl.
| | | |
|---|---|---|
| *H04B 1/00* | (2006.01) | |
| *H04B 1/28* | (2006.01) | |
| *G06F 16/901* | (2019.01) | |
| *H04B 1/16* | (2006.01) | |
| *H04B 1/04* | (2006.01) | |
| *H04B 17/318* | (2015.01) | |
| *G01S 19/07* | (2010.01) | |
| *G01S 19/34* | (2010.01) | |
| *G01S 19/37* | (2010.01) | |
| *H03D 7/16* | (2006.01) | |
| *G01S 19/24* | (2010.01) | |
| *G01S 19/31* | (2010.01) | |

(52) U.S. Cl.
CPC ............... *H04B 1/001* (2013.01); *H04B 1/16* (2013.01); *H04B 1/18* (2013.01); *H04B 1/28* (2013.01); *G01S 19/07* (2013.01); *G01S 19/243* (2013.01); *G01S 19/31* (2013.01); *G01S 19/34* (2013.01); *G01S 19/37* (2013.01); *H04B 17/318* (2015.01); *H04B 2001/0491* (2013.01)

(58) Field of Classification Search
CPC ........ H04B 2001/0491; H04B 7/18513; H04B 7/18508; H04B 7/1851; H04B 7/18515; H04B 7/18517; H04B 7/18528; H04B 7/1853; H04B 7/18534; H04B 7/18576; H04B 7/18578; H04B 7/18595; H04B 7/19; H04B 7/195; H04B 1/16; H04B 17/102; G01S 19/07; G01S 19/243; G01S 19/31; G01S 19/34; G01S 19/37; G01S 19/11; G01S 19/02; G06F 16/9017; H03D 7/163

See application file for complete search history.

(56) References Cited

U.S. PATENT DOCUMENTS

| | | | |
|---|---|---|---|
| 6,072,994 A * | 6/2000 | Phillips | G01S 13/767 375/219 |
| 6,381,471 B1 * | 4/2002 | Dvorkin | H04B 1/406 455/552.1 |
| 7,847,730 B2 | 12/2010 | Ryba | |
| 8,213,876 B2 | 7/2012 | Sankar et al. | |
| 8,725,085 B2 * | 5/2014 | Darabi | H04B 1/525 455/78 |
| 9,136,894 B2 | 9/2015 | Lee et al. | |
| 9,645,246 B1 * | 5/2017 | Jia | G01S 19/34 |
| 11,073,622 B2 * | 7/2021 | Cohen | G01S 19/11 |
| 2004/0085933 A1 * | 5/2004 | Wang | H01Q 3/42 370/334 |
| 2006/0046716 A1 | 3/2006 | Hofstaedter et al. | |
| 2007/0243899 A1 * | 10/2007 | Hermel | H04W 16/26 455/553.1 |
| 2010/0295727 A1 * | 11/2010 | Smith | G01S 19/37 342/357.77 |
| 2012/0022779 A1 * | 1/2012 | Lee | G01S 19/21 701/408 |
| 2014/0064341 A1 * | 3/2014 | Johansson | H04B 1/0067 375/219 |
| 2020/0021327 A1 * | 1/2020 | Ciccarelli | H04B 1/525 |

\* cited by examiner

AGILE NAVIGATION TRANSMITTER SYSTEM THAT INCLUDES A SINGLE AMPLIFIER SYSTEM

CROSS-REFERENCE TO RELATED APPLICATIONS

This application claims the benefit of U.S. Provisional Application No. 62/869,841, filed on Jul. 2, 2019, and titled "AGILE NAVIGATION TRANSMITTER SYSTEM". Any and all applications for which a foreign or domestic priority claim is identified above and in the Application Data Sheet as filed with the present application are hereby incorporated by reference under 37 CFR 1.57.

BACKGROUND

Technical Field

The general inventive concepts relate generally to a broadcast system for producing radio frequency navigation signals directly from a digital processor with any software defined waveform and anywhere within a target carrier band, e.g., the 1 GHz band between 1-2 GHz, without up conversion and with minimal hardware.

Description of the Related Art

Navigation signal transmission for use in Position, Navigation, and Timing applications need signal agility in frequency and waveform in order to avoid interference and reduce probability of detection. Current space-based Global Navigation Satellite Systems (GNSS) services transmit multiple fixed signals at multiple fixed frequencies. Examples of GNSS include GPS, GLONASS, BeiDou, and Galileo. While generally useful, these systems are inflexible and do not offer signal agility. This inflexibility is because the GNSS transmitter systems use fixed hardware systems for each individual signal. In such systems, each signal is generated separately in a hardware and the multiple GNSS signals are mixed prior to being provided to an antenna for transmission. Such systems also require up-converters for navigation signal transmission to accommodate software/firmware and hardware limitations. Thus, implementing each signal with a separate hardware architecture adds size, weight, power and cost to the GNSS.

SUMMARY

To address certain disadvantages of systems described above, disclosed herein are methods and systems for transmitting one or more navigation signals that convert the digital data stream containing all navigation signals across the band directly to analog signals at broadcast RF frequencies.

In one embodiment, a transmission system for providing navigation signals is provided. The system comprises a splitter circuit configured to receive a plurality of radio frequency (RF) signals oscillating at at least two different frequencies $f_1$ and $f_2$. The splitter circuit is further configured to split and forward the RF signals having the $f_1$ frequency to a first bandpass filter and the RF signals having the $f_2$ frequency to a second bandpass filter. The system further comprises a first tunable amplifier configured to receive the RF signals from the first bandpass filter. The system further comprises a second tunable amplifier configured to receive the RF signals from the second bandpass filter at substantially the same time as the first tunable amplifier's receipt of the RF signals from the first bandpass filter. The first tunable amplifier is further configured to amplify its RF signals across a first band centered around the frequency $f_1$. The second tunable amplifier is further configured to amplify its RF signals across a second band centered around the frequency $f_2$. The amplified RF signals are fed substantially concurrently into a mixer circuit for transmission via an RF antenna to a navigation receiver.

In another embodiment, a method of amplifying and providing navigation signals to a navigation receiver is provided. The method comprises receiving a plurality of radio frequency (RF) signals oscillating at at least two different frequencies $f_1$ and $f_2$. The method further comprises splitting and forwarding the RF signals having the $f_1$ frequency to a first bandpass filter and the RF signals having the $f_2$ frequency to a second bandpass filter. The method further comprises receiving the RF signals from the first bandpass filter. The method further comprises receiving the RF signals from the second bandpass filter at substantially the same time as the first tunable amplifier's receipt of the RF signals from the first bandpass filter. The method further comprises amplifying by a first tunable amplifier the RF signals received from the first bandpass filter across a first band centered around the frequency $f_1$. The method further comprises amplifying by a second tunable amplifier the RF signals received from the second bandpass filter across a second band centered around the frequency $f_2$. The method further comprises feeding the amplified RF signals substantially concurrently into a mixer circuit for transmission via an RF antenna to the navigation receiver.

The above and other aspects and advantages of the general inventive concepts will become more readily apparent from the following description and figures, illustrating by way of example, the principles of the general inventive concepts.

BRIEF DESCRIPTION OF THE DRAWINGS

Certain embodiments of the above-mentioned aspects, as well as other features, aspects, and advantages of the present technology will now be described in connection with various aspects, with reference to the accompanying drawings. The illustrated aspects, however, are merely examples and are not intended to be limiting. Throughout the drawings, similar symbols typically identify similar components, unless context dictates otherwise. Note that the relative dimensions of the following figures may not be drawn to scale. The following drawings and the associated descriptions are provided to illustrate embodiments of the present disclosure and do not limit the scope of the claims.

DETAILED DESCRIPTION OF CERTAIN INVENTIVE ASPECTS

Figure 1A:
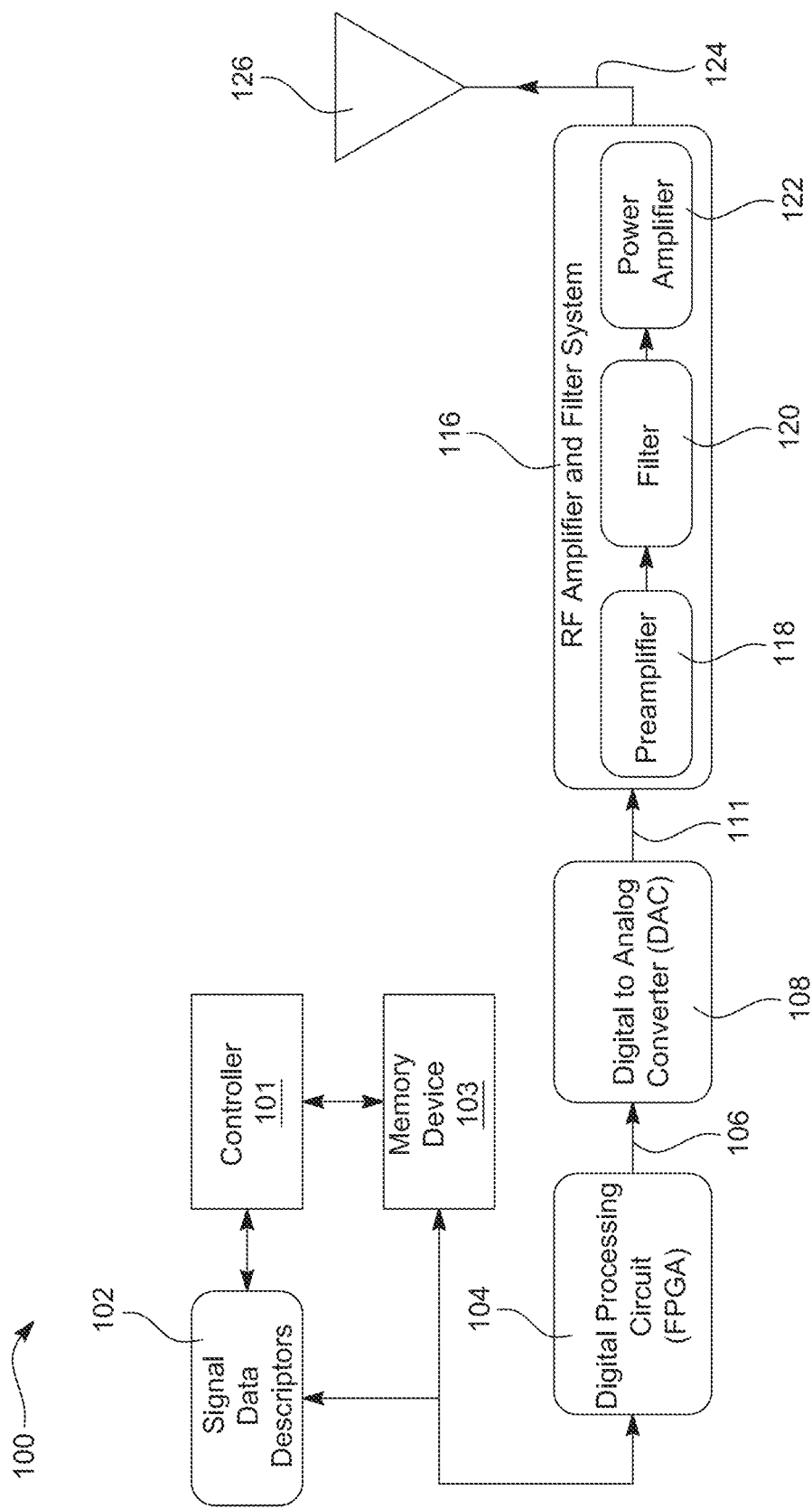
FIG. 1A is a block diagram of the ANTS according to an exemplary embodiment that produces a signal intended for navigation.

The features, aspects and advantages of the present disclosure will now be described with reference to the drawings of several embodiments which are intended to be within the scope of the embodiments herein disclosed. These and other embodiments will become readily apparent to those skilled in the art from the following detailed description of the embodiments having reference to the attached figures, the development not being limited to any embodiment(s) herein disclosed.

As indicated above, methods and systems for generating and transmitting navigational signals including GNSS signals are disclosed. An example of a direct digital synthesis signal transmission system for signals or navigation signals includes a digital processing circuit, a digital to analog converter (DAC), frequency filter(s), a radio frequency (RF) amplifier in communication with an output of the digital to analog converter, and an antenna electrically coupled to an output of the RF amplifier. All of these structural components are described in detail in association with the figures below. The digital processing circuit can include instructions that when executed cause the digital processing circuit to produce digital outputs representing RF or navigation signals of any waveform and frequency within a target band, for example, the 1 GHz band between 1-2 GHz. The generated digital output does not require up conversion to achieve frequencies required for transmission of the signals due to DAC speeds and the relatively lower L and S Band operating frequencies. While certain example embodiments are shown by way of example in the drawings and will herein be described in detail, these embodiments are capable of various modifications and alternative forms. It should be understood that there is no intent to limit example embodiments to the particular forms disclosed, but on the contrary, example embodiments are to cover all modifications, equivalents, and alternatives falling within the scope of example embodiments. For instance, although this disclosure describes the generation of signals in the 1-2 GHz range in certain embodiments, the disclosure is not limited to such band or frequencies. For example ANTS could be extended up to 6 GHz out of the DAC, or to even higher frequencies. In other embodiments, the systems and methods described herein may be implemented for generation of signals in other frequency bands, especially with anticipated technology and speed advancements for processors and DACs.

In certain embodiments for multiple simultaneous navigation signals individually transmitted anywhere within a wide band, the transmission system will create and transmit multiple signals at differing amplitudes at unique frequencies within the complete frequency range without up-converters, and with a single hardware path through the use of a single multi-band tunable amplifier. Here, the entire frequency band range of signals is formed simultaneously through the digital signal processing phase and the entire band of digitized signals is presented to the DAC. One or more amplifiers may be used to amplify a specific band(s) of signals or the entire frequency band of signals. In one embodiment, and as described in connection with FIG. 10, a single amplifier that amplifies a plurality of signals across specific frequency band(s) may be used.

An agile navigation transmission system (ANTS) is configured to create one or more digital signals in software anywhere across a target frequency band, e.g., the 1 to 2 GHz frequency band, via the direct digital synthesis method. This is presented to a very high-speed digital-to-analog converter (DAC) operating at rates much higher than Nyquist to directly create a signal in analog at the signal's transmitted RF within a wide band, e.g., the 1 GHz band between 1-2 GHz, without the need for up conversion. For the generation and transmission of two or more navigation signals, as is required for space operations that encounter the ionosphere and for terrestrial signal systems that generate both standard GNSS navigation signals and alternate navigation signals, an exemplary embodiment digitally creates the entire band containing all signals, converted to analog, and propagated through the system transmittal out of an antenna. In an exemplary embodiment, the hardware implementing the ANTS method creates, in response to a software waveform description, one or more multiple navigation signals simultaneously transmitted within a range of frequencies from 1 to 2 GHz. The single or multiple signal amplitudes are individually controlled during creation, and the start time and duration of transmission is controlled. In this way, ANTS has the capability to transmit standard GNSS signals such as GPS L1 C/A Code as well as any other type of signal, navigation or otherwise, with any modulation scheme and frequency within the target band, e.g., the 1 to 2 GHz band (i.e., L-Band).

For a single signal broadcast, a variable bandpass filter is applied to cover the navigation signal's waveform spectrum anywhere within the target band, e.g., the 1 to 2 GHz band or wideband capability range. For multi-signal broadcast, a single multi-band tunable amplifier is utilized rather than multiple amplifiers. In an exemplary embodiment, bandpass filtering is applied with the addition of intra-band noise cancellation consisting of software digital processing and a tunable multi-bandpass amplifier. The analog signals are then propagated through an antenna for transmission. Such a system can be smaller, less expensive, remotely reprogrammable, scalable by deployment—ground, air, space—and has the flexibility to produce and transmit on command a signal or signals at any frequency, with variable power, and within a desired frequency range without requiring up-converters.

As described in connection with FIG. 1, an exemplary embodiment, the ANTS comprises a digital processing circuit which is a field programmable gate array (FPGA), a digital to analog converter (DAC), a clocking synchronization system, a reference system providing PNT source info and time to the clock synchro, and then analog components consisting of a preamplifier, a band pass filter, a power amplifier, and antenna. As the entire band is propagated through the system there is also no need for signal combining or mixing prior to the antenna. The entire band is presented to the antenna for broadcast.

In such embodiments, the digital signal processing circuit consists of high-speed firmware implemented in VHDL Hardware Description Language (VHDL) for control and signal algorithms operating on the FPGA that create and digitize the entire spectrum, e.g., the 1 GHz spectrum between 1-2 GHz, for presentation to a very high-speed DAC operating at an appropriate speed, e.g., 6 GHz or higher for the 1 GHz spectrum between 1-2 GHz. This is triple the Nyquist rate to achieve the 2 GHz carrier frequency to prevent signal aliasing and other mutual interference as was determined both by signal processing calculations and hardware testing with spectrum capture. In order to achieve the throughput requirements, a high pin count FPGA Mezzanine Card (FMC) is utilized in exemplary embodiments and the digitized signals, along with other controls, are communicated in parallel through the FMC to the DAC. High accuracy clocking, memory, interleaving and controls are applied to ensure that the FPGA communicates the spectrum of signal(s) faithfully to the DAC so that the digitized spectrum is accurately converted to assemble the analog signal spectrum across the 1 GHz band.

Figure 2:
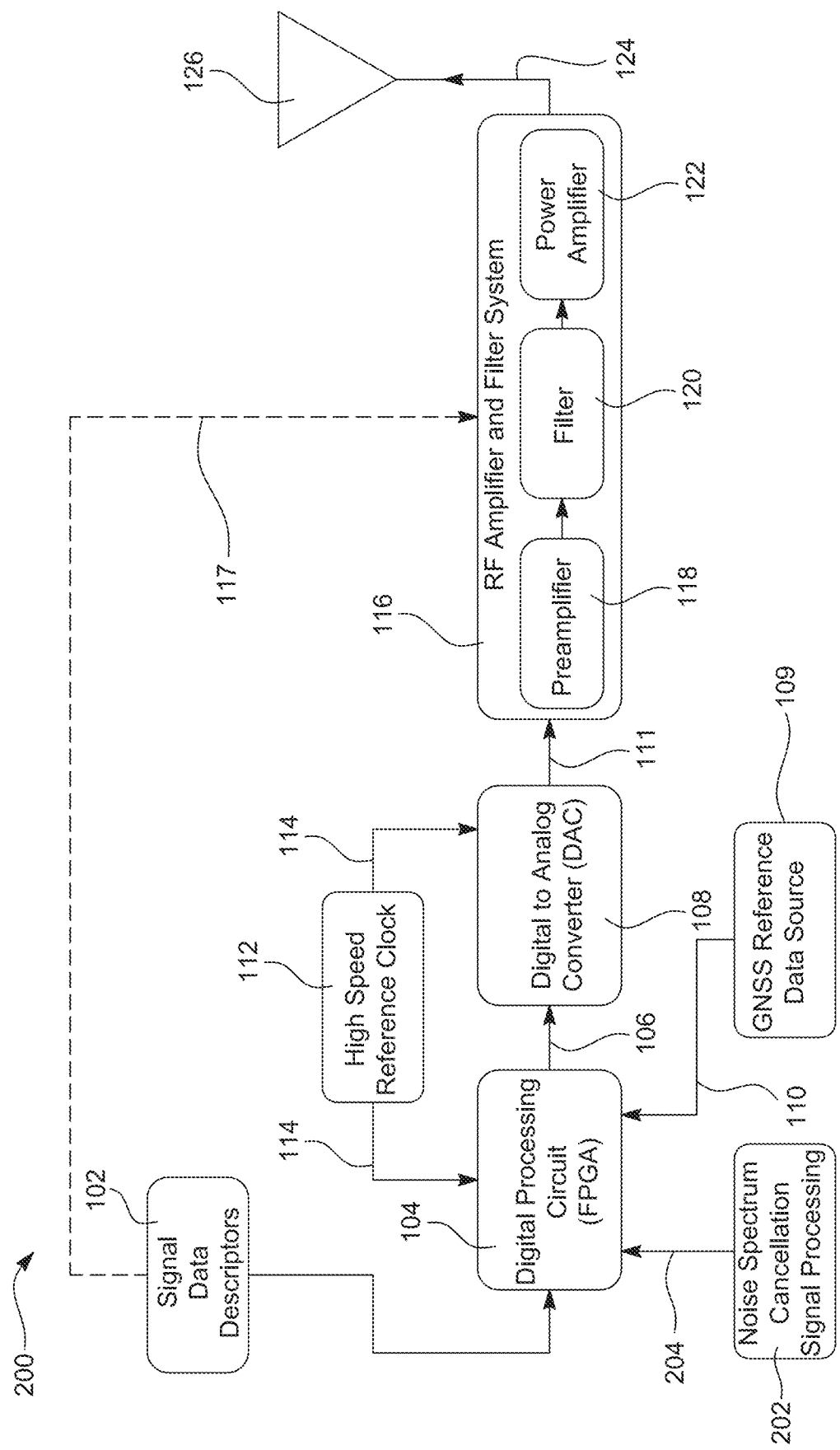
FIG. 2 is a block diagram of ANTS according to an exemplary embodiment where multiple navigation signals are transmitted requiring the implementation of noise cancellation processing prior to conversion to remove intramodulation products between signals of interest.
Figure 3:
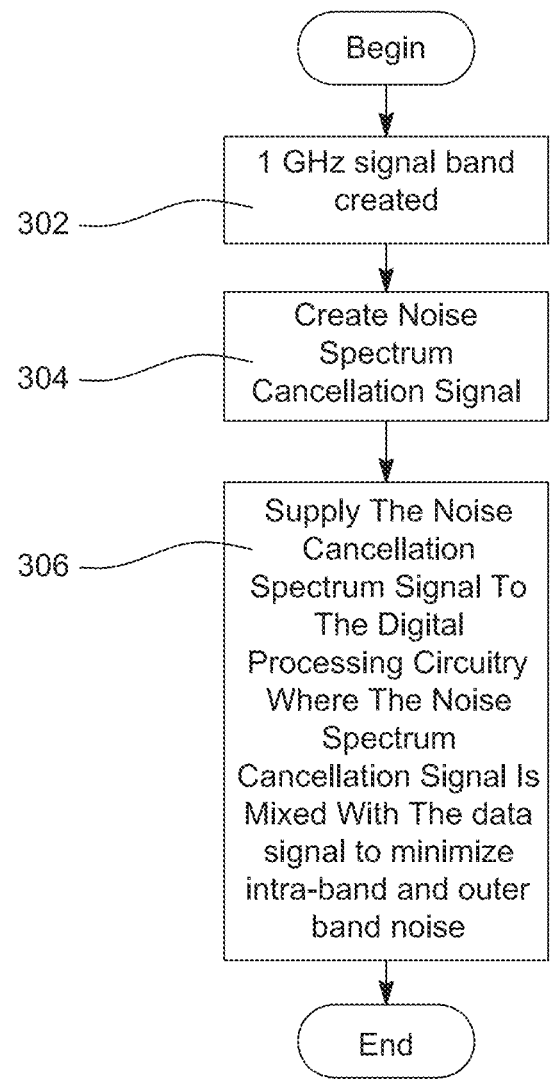
FIG. 3 is more detail in a flow chart that lists the steps used to perform the noise cancellation step as shown in FIG. 2.

In certain exemplary embodiments for multi-signal creation and broadcast as shown in FIGS. 2 and 3, a band-specific noise cancellation signal or filter may be created and supplied to the digital processing subsystem or FPGA. This signal can be adjusted to compensate for extra noise residing across the portions of the target band, e.g., the 1 GHz band between 1-2 GHz, that do not contain the desired navigation transmission signals. This processing ensures that the intra-band regions between the desired navigation signals are quiet or minimized. This is performed because the entire band is being propagated out of the DAC and noise in the form of harmonics and other sources may be created in these intra-band spaces across the 1 GHz band. As navigation signals are spread spectrum in nature and of very low power residing below the noise floor, noise must be greatly minimized so that ANTS does not amplify and thus broadcast noise in addition to signal.

The gains of the output antenna across a frequency spectrum varies and may be theoretically calculated, measured, or otherwise determined by antenna type. In certain exemplary embodiments, gain control amplitude adjustments are applied to the digital processing circuit during FPGA signal generation to adjust the gain of the produced signal across the spectrum to compensate for and to minimize the effects of frequency driven gain variability. The ability to perform this is limited by the dynamic range of the DAC and in its current embodiment has a range of 7 dB. In this manner, the commanded radiated power requirements are achieved to consider the variability of gain across the target band, e.g., the 1 GHz band between 1-2 GHz, for a mechanical antenna by individually adjusting the power or amplitude of the navigation signal(s) as a function of carrier frequency. This antenna gain adjustment is shown FIG. 4.

In order to facilitate an understanding of the systems and methods discussed herein, a number of terms and acronyms are defined below. The terms defined below, as well as other terms used herein, should be construed to include the provided definitions, the ordinary and customary meaning of the terms, and/or any other implied meaning for the respective terms. Thus, the definitions below do not limit the meaning of these terms, but only provide exemplary definitions.

ANTS: agile navigation transmission system
BDS: BeiDou navigation satellite system
BPSK: binary phase shift keying
BOC: binary offset carrier
DAC: digital to analog converter
DDS: direct digital synthesis
FPGA: field programmable gate array
FMC: FPGA mezzanine card
GLONASS: global navigation satellite system (Russian)
GNSS: global navigation satellite system—generic term for all RF navigation systems
GPS: global positioning system
PNT: positioning, navigation, and timing
RF: radio frequency
VHDL: (or VHSIC-HDL: Very High Speed Integrated Circuit Hardware Description Language) is a hardware description language used in electronic design automation to describe digital and mixed-signal systems such as field-programmable gate arrays and integrated circuits.

GNSS generally refers to the several satellite-based systems for providing location capabilities to electronic equipment receivers that passively process multiple GNSS signals simultaneously. There are various GNSS satellite navigation systems available including GPS, GLONASS, Galileo, and the BeiDou Navigation Satellite System (BDS). These systems generally utilize a network of space-based satellites controlled by a ground segment and user receivers that calculate their positions based upon the transmitted navigation signals' modulations and data content. The GNSS broadcast constellations transmit signals using set frequencies and waveforms which comprise timing and satellite location or identification information and other data, such as corrections, encoded in the transmitted signals. The ANTS can be deployed in space on a satellite or terrestrially on an airborne or ground platform that is either stationary or moving. Differences by deployment would vary by environment and range (i.e. power). In an exemplary embodiment, the ANTS capability to transmit navigation signals includes all current GNSS signals and any other navigation signal or RF signal within the target band, e.g., the 1 GHz band between 1-2 GHz. Electronic equipment, such as military and civilian guidance systems, receive signals from a plurality of satellites and use the location of the satellite determined from the signal data and the timing information provided in the signal along with similar information from the other satellites in the plurality of satellites to calculate the location, time, direction of travel, altitude, and speed of the electronic equipment receiving the signals.

Illustrative Example of an Agile Navigation Transmitter System

FIG. 1A is a diagram of the ANTS (sometimes simply referred to as the "transmitter system 100") according to an exemplary embodiment. The transmitter system 100 produces a signal intended for navigation of receivers. As shown in FIG. 1A, a signal data descriptor 102 generates instructions to a digital processing circuit 104 (e.g., a Signal Generation (e.g., FPGA)) where signal spectrum generation and digitization of signals occur. As will be understood by one of ordinary skill in the art, in one embodiment, the signal data descriptor 102 is configured to generate signal data in digital format. The signal data descriptor is typically equipped or has access to a non-volatile memory device 103 to retrieve signal characteristics therefrom. The non-volatile memory device 103 may physically reside within the signal data descriptor 102, within the digital processing circuit 104, within another structural unit of the transmitter 100, and/or may reside as a distinct structural unit on its own. As will be described in connection with FIG. 9, the non-volatile memory device 103 may advantageously be configured to receive data and instructions from a remote location comprised of new or updated signal characteristics for specifying new navigation signals to the digital processing circuit 104. In one embodiment, the signal descriptor 102 specifies the signal characteristics to the digital processing circuit 104, which in turn generates one or more navigation signals for transmission from the position (e.g., location in space) of the transmitter 100 to one or more navigation receivers (not shown in this figure), e.g., on earth. The signal characteristics includes at least one of a carrier frequency (e.g., a center frequency and bandwidth), a waveform type, structure format of data (to be transmitted), modulation type(s), clock or timing information, transmitter position, and other information that may be desirable or necessary for a navigation receiver to determine its position based on signals received by the transmitter 100. Thus, the signal data descriptor 102 is equipped with the ability to specify many signal characteristics for generation and transmission by other components of the transmitter 100.

In one embodiment, the signal data descriptor 102 operates under the direction of a controller 101 that is operationally connected to the signal data descriptor 102. The controller 101 may physically reside within the signal data descriptor 102, within the digital processing circuit 104, within another structural unit of the transmitter 100, and/or may reside as a distinct structural unit. The controller 101 determines the signal characteristics to be generated by and instructs the signal data descriptor 102 to generate such determined signal characteristics. The controller 101 may consider several conditions when determining the signal characteristics, such as user input or instructions, pre-programmed instructions, navigation receiver requirement(s), new instructions received from external sources, or any other criteria that may be programmed at time of commissioning the transmitter 100. With the availability of multiple signal characteristics by the signal data descriptor 102, the transmitter 100 offers several advantages, such as agility in accommodating multiple navigation requirements and conditions.

Upon receiving signal characteristics from the signal descriptor 102, the digital processing circuit 104 performs formatting and conversion operations to convert the data 102 into a proper format for creating the desired navigation signal(s) pursuant to the specified signal characteristics. Signal generation firmware residing on the digital processing circuit (FPGA) creates the individual navigation signals. Signals from an entire target band, e.g., the 1 GHz band between 1-2 GHz, are generated by software instructions within the digital processing circuit 104 and digitized for design. Implementation simplicity and consistency are provided to the high-speed DAC for conversion directly to RF. Navigation signals in L-Band (1 to 2 GHz) lend themselves to direct conversion as DAC technology has recently achieved 6 GHz and higher speeds. As noted earlier, the signals may be generated using Binary Phase Shift Keying, Binary Offset Carrier, or other modulation describable in math or tables. As will be further understood, exemplary embodiments may be configured to convert the data 102 into a plurality of formats defined by programming executed by the digital processing circuit 104. While many different sources of digital processing circuits 104 may be used, an example of such a circuit may be based on the Xilinx Virtex UltraScale FPGA such as part number XCVU09-2FFVA2104E. In implementation, the entirety of the capabilities of this card is not required; the Xilinx card was employed for its FPGA capabilities. In implementation a customized printed circuit board would be created. As is understood by one of ordinary skill in the art, additional circuitry such as a volatile and non-volatile memory, the above-described operations, and interface components may be required to implement the digital signal processing performed in the FPGA device.

In an exemplary embodiment, the signal can be any software created signal type within the target band, e.g., the 1 GHz band between 1-2 GHz. For example, signals can employ formats such as Binary Phase Shift Keying (BPSK), Binary Offset Carrier (BOC), modulations for data, encryption, narrow and wideband signals, low power/low intercept signals, and more. Exemplary embodiments receive instructions and data via a digital interface over Ethernet via an external command and control (C2) receiver, PC/laptop, other, and pre-programming. Each signal can be transmitted with a distinct amplitude. For example, without limitation, such an interface may comprise a TCP/IP interface.

Thus, in accordance with certain embodiments, the signal generation and processing is embedded in software that specifies substantially all waveform characteristics for creating and processing navigation signals. The entire desired band of digital signals is formed by the software in the digital processing circuit 104 (FPGA) pursuant to signal characteristics received as data from the signal data descriptor (102). There are several benefits in implementing generation of navigation signal based on waveform characteristics specified in software form within or accessible by the transmitter 100. For instance, the transmitter 100 is capable of accommodating the generation of multiple navigation signals based on separate waveform characteristics without the necessity to replace, add, or adjust hardware components of the transmitter 100. In addition, the transmitter 100 is capable of adding new or updating existing waveform characteristics by receiving new waveform characteristics wirelessly while positioned in space. Such benefits are of particular advantage in navigation systems that rely on a transmitter that may be located hundreds of miles away in space.

As indicated above, the signals generated by the digital processing circuit 104 are digitized via a Direct Digital Synthesis method (DDS). In one embodiment, DDS is greatly improved in speed by implementing DDS in table lookup format. The lookup table may reside in the non-volatile memory 103 or other memory structures and configurations as desired. In one embodiment, the lookup table may reside in a non-volatile memory within the digital processing circuit 104. The advantage of using the lookup table is its fast speed. The DDS method allows to simply getting a digital signal value from a list of digital signal values stored in the lookup table, which is much faster than calculating a digitized signal value with an algorithm or using a quantization or other function. Additionally, the lookup table may store non-standard digital signals for creation that can also be generated as determined through instructions via signal data descriptor 102.

The formatted digital signal data 106 generated by the digital processing circuit 104 is fed into or provided to a digital-to-analog converter (DAC) 108 via the FMC for conversion directly to an analog signal(s) 111 without the use of up-converters through high-speed sampling that greatly exceed Nyquist to prevent aliasing. In exemplary embodiments, the analog signal 111 from DAC 108 requires no subsequent up conversion for transmission and there is no implicit up conversion within the DAC. The DAC employed in this embodiment performs no such up-conversions internally. The formatted signal data 106 in exemplary embodiments is digital data that comprises information corresponding to discrete points on the waveform across the entire spectrum (e.g., 1 GHz wide or greater) to be converted by the DAC 108. In another embodiment, the basic principles described herein are not limited to the 1 GHz spectrum and may be applied to any frequency band from which propagation via the air medium (i.e., RF) is possible. Irrespective of the band, the digital signals are thus converted to an analog signal without the need for upconversion, and thereafter filtered and amplified for transmission. Exemplary embodiments can be configured to provide for the simultaneous transmission of multiple signals across a target band, e.g., the 1 GHz band between 1-2 GHz.

The discrete points thus result in one or more waveforms and distinct amplitudes and bands for the waveform(s). The result is that the formatted data not only provides a waveform shape but also an amplitude as determined in the digital processing circuit 104. This amplitude can be used to adjust the output level of the transmitter system 100 for each generated signal within the 1 GHz band while using an identical amplifier gain for the entire band. In an exemplary embodiment, the DAC 108 may comprise the Analog Devices (ADI) DAC AD9176-FMC-EBZ (www.analog-.com/en/index.html) or equivalent. Exemplary embodiments should have an update rate that is high enough to prevent aliasing of the output signal and should truly perform direct to RF analog conversions without upconverting. This provides the capability for the transmission of spreading codes, data, and encryption, with no need for up-converters. A complete 1 GHz band is created and propagated through the system.

The converted signals from the entire target band, e.g., the 1 GHz band between 1-2 GHz, are then provided to an analog processing system 116 and exemplary embodiments of the analog processing is shown within that functional block. In one embodiment, the analog processing system 116 includes an RF preamplifier 118 connected in series with a band pass filter 120 that is connected in series to an amplifier 122. The RF preamplifier 118 is operationally positioned at the input of the analog processing system 116 for receiving the analog signal(s) 111 from the DAC 108. The preamplifier 118 verifies noise condition and may adjust the level of the received analog signals 111 for further processing. The filter 120 may comprise one or more of a low-band, bandpass, or high-pass filter that filters out any undesired noise and/or out of band signals for transmission over the air interface. The power amplifiers 122 receives the filtered analog signals from the filter 120, and amplifies the power to generate amplified signals 124 at a power level that is sufficient for transmission from the transmitter 100 in space and receipt by one or more navigation receivers on earth. The amplified signals 124 are provided to an antenna 126 for transmission over the air medium to navigation receiver(s) on earth. It is worth noting that the embodiment described for FIG. 1A may or may not have the intended purpose of transmitting a signal for navigation purposes by a receiver, but the signal must reside within the target band, e.g., the 1 GHz band between 1-2 GHz.

Figure 1B:
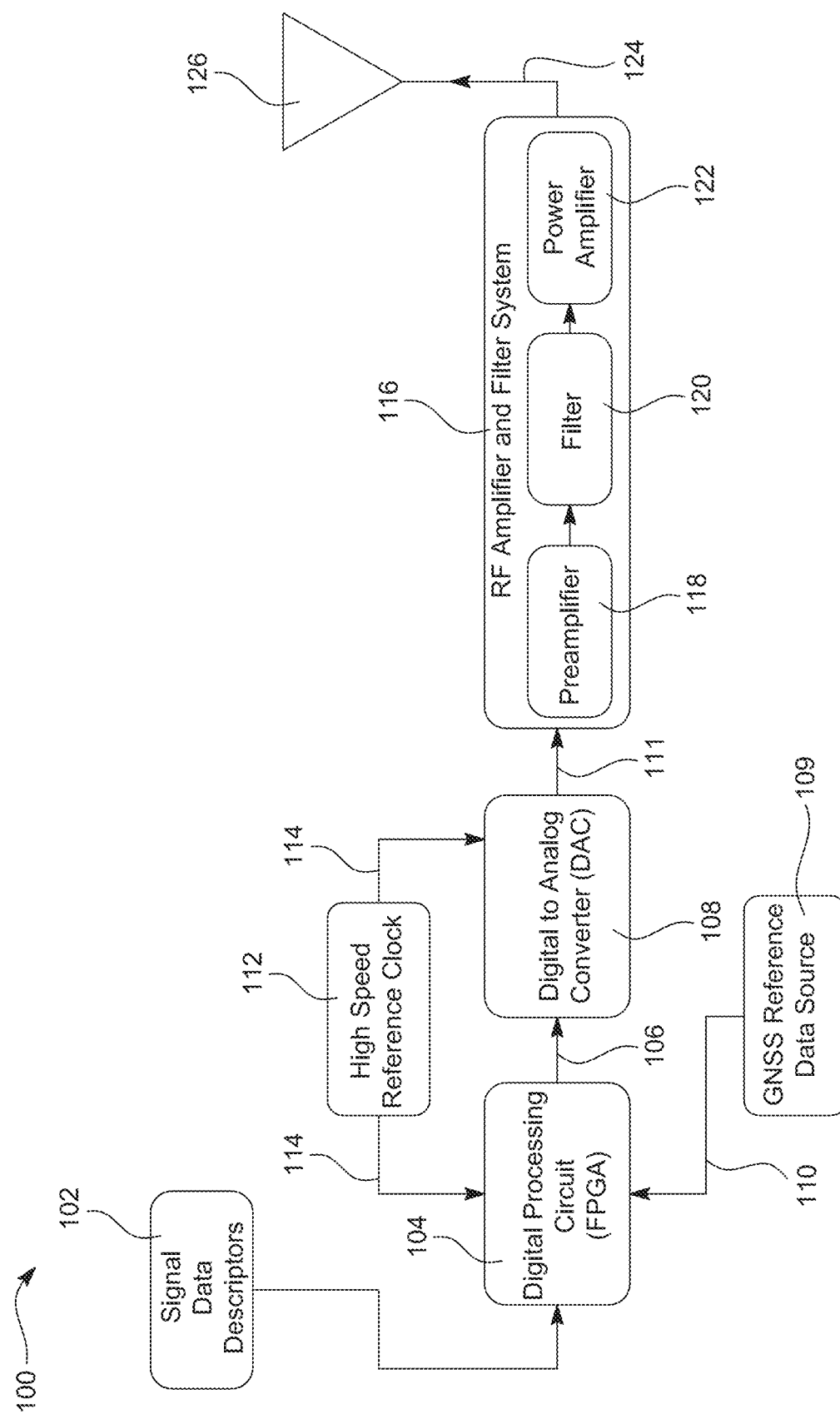
FIG. 1B is a block diagram of the ANTS according to an alternate exemplary embodiment that includes a clocking source and a GNSS reference data source.

FIG. 1B is a block diagram of ANTS according to an alternate exemplary embodiment that includes a clocking source and a GNSS reference data source. In one embodiment of FIG. 1B, ranging signals were created and tested for a 5 unit ANTS constellation. Here, PNT is achievable with software defined radio receivers. All that was described for FIG. 1A applies to FIG. 1B with the additions described herein. The exemplary ANTS system shown in FIG. 1B includes a clocking source 112 to provide timing and synchronization 114 to the FPGA processor and the DAC. Identical or different clocks or clocking rates can be employed. Exemplary embodiments of ANTS rely upon a single clocking source whose rate is scalable as is required by the various processing rates within the FPGA and the DAC. The clocks transmit timing pulses 114 to control and synchronize the FPGA digital processor and the DAC as needed for the high-speed operations being performed across the many parallel interfaces to include a very high pin count FPGA Mezzanine Card (FMC) connector (not shown). An example of such a high-speed reference clock 112 is available from Texas Instruments (www.ti.com) as part number LMX2595.

A method for providing position and time information of the transmitter is performed by adding data modulated onto the navigation signal(s). This is required when the location of the ANTS transmitters is not known. GNSS transmit singles provide location information to user receivers which measure range and subsequently calculate their own positions. The required data can be provided by a source from the ANTS's host platform, a one-time data loader in the case of static deployment, a comm link, or as shown, from any GNSS receiver 109. This information 110 is required for the data processor to develop the ANTS's ephemeris and time information which is modulated onto the navigation signals for use by a navigation receiver to calculate its position. There are hundreds of candidate GNSS receivers that are candidates for this purpose for commercial receivers and a much smaller number for military applications.

FIG. 2 is a block diagram of an ANTS system 200 according to an exemplary embodiment where multiple navigation signals are transmitted requiring the implementation of noise cancellation processing. As is illustrated in the ANTS system 200 of FIG. 2, measures may be used to reduce and minimize the noise in the outer band regions of the analog signal 111 for a single signal navigation system, and between the multiple signals within the larger target band, e.g., the 1 GHz band between 1-2 GHz, for multi navigation signal systems. A noise spectrum cancellation algorithm within the FPGA processor 202 provides a digitized noise cancellation signal 204 across the band to the digital processing circuit 104 to be mixed with the intended signal to reduce unwanted intra and outer band noise. This signal 204 is blended with digital signal data produced by the digital processing circuit 104 such that noise across the desired frequency band is suppressed. This removes any spurs, sidebands, or other extraneous noise resulting from the creation of the limitless types of data signals. The noise minimization processing is synonymous with smart filtering.

Another source of unwanted noise can occur in the amplifier that is used to transmit multiple data signals each with their own bandwidth. In between and outside each signal it is very desirable and highly advantageous not to amplify the noise floors in these non-data-signal regions which inadvertently might result in the ANTS system appearing as a noise jammer. Data signal characteristic data 117 is used to control and tune the amplifier for this purpose.

FIG. 3 is a flow chart listing the steps used to compensate for noise present in the amplified output signal of an exemplary embodiment. Referring to the flow chart of FIG. 3, in step 302, the process for minimizing intra band noise when the signal is created is shown. In response to the final spectrum of signals across the target band, e.g., the 1 GHz band between 1-2 GHz, the noise cancellation spectrum signal generator 202 is enabled in step 304 such that a noise cancellation spectrum signal 204 is provided to the digital processing circuit 104 of FIG. 2, in step 306 for mixing with digital signal data such that residual noise in the signal intra-band and outside band noise are minimized. This mixing is effectively a smart software filter that forces unwanted signal regions to be notched. The bands for the noise cancellation filter will vary by the navigation signal waveforms and frequencies being generated at an instant in time.

Figure 4:
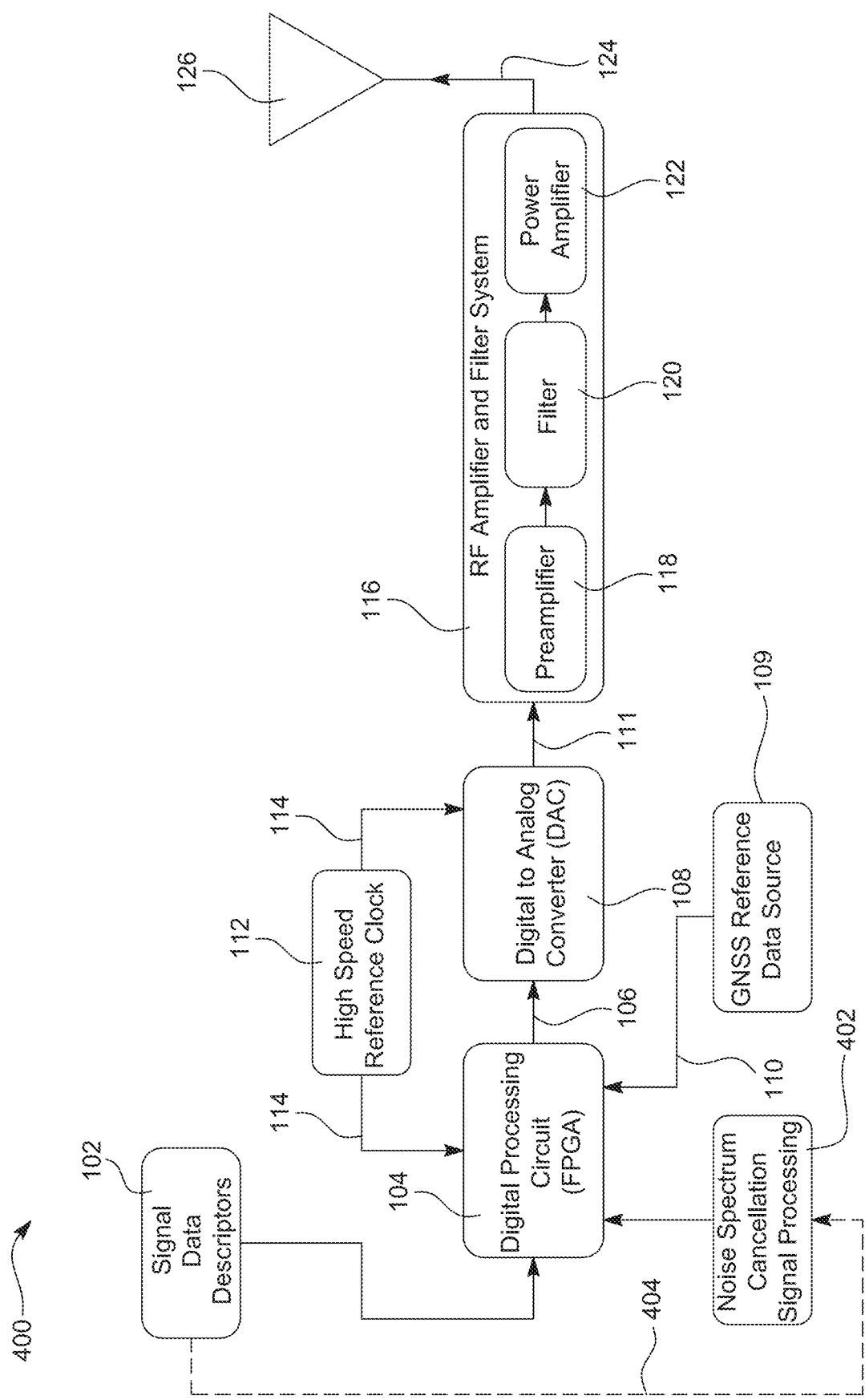
FIG. 4 is a block diagram of ANTS according to an exemplary embodiment for antenna gain compensation during digital signal processing, wherein the directivity of the antenna is considered for creating the commanded effective radiated power.

FIG. 4 is a block diagram of ANTS according to an exemplary embodiment for antenna gain compensation during digital signal processing. Referring to the ANTS system 400 of FIG. 4, an antenna gain compensation process 402 may be used to adjust for antenna gain variability within the target band, e.g., the 1 GHz band between 1-2 GHz. As is understood by those of ordinary skill in the art, a transmission antenna 126 will have levels of gain or directivity that vary across a frequency range. For a fixed antenna size, gain increases as frequency is increased. For ANTS signals that can be generated between 1 and 2 GHz, the variation can be 5 dB or more which is significant. The specific transmission antenna 126 used in exemplary embodiments may be dependent upon the application to which the ANTS system is applied. ANTS may be configured via software commands to produce RF signals at various frequencies across a band of frequencies at specified powers. Because of the gain level variability of the transmission antenna 126, actual transmitted signal strength varies across the band of frequencies unless some sort of compensation 404 is applied and this variability may be undesirable. Exemplary embodiments of the ANTS system include unique scaling factors by antenna to adjust the amplitude of each signal to achieve the commanded effective radiated power.

Figure 5:
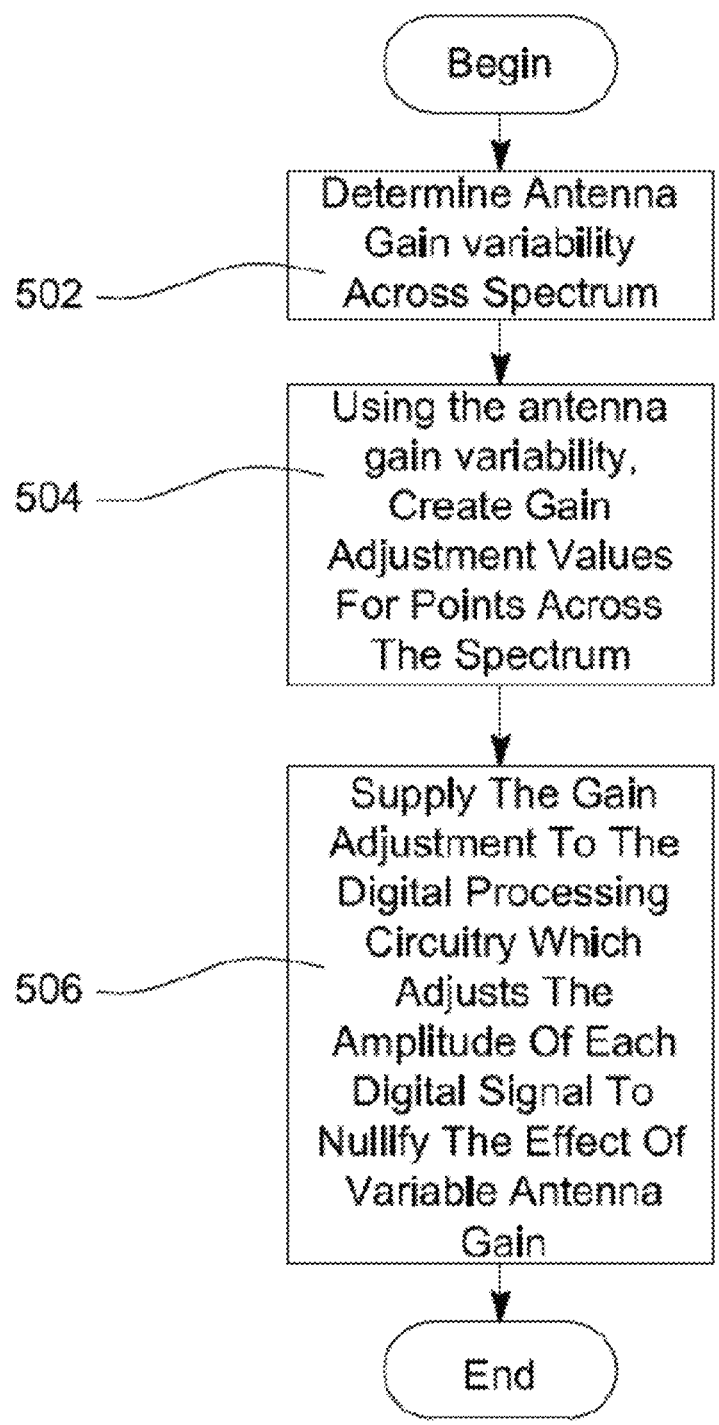
FIG. 5 is a flow chart listing the steps used to compensate for gain variability across the band in a transmission antenna in the exemplary embodiment shown in FIG. 4.

FIG. 5 is a flow chart listing the steps used to compensate for gain variability across the band in a transmission antenna in an exemplary embodiment. In step 502, the gain of the antenna 126 across the desired frequency band is theoretically calculated, measured, or otherwise determined and stored in memory by antenna type prior to operation. In exemplary embodiments, gain adjustment data is determined (theoretically calculated, measured, or otherwise determined) for a specific type of antenna and used for antennas of that type. In other exemplary embodiments, gain adjustment data is determined (theoretically calculated, measured, or otherwise determined) for one specific antenna and used for that one antenna. This gain adjustment data is provided to the signal processor as shown by the dotted line 404 of FIG. 4. This measurement is provided to the antenna gain compensation device 402 which creates an adjustment gain value in step 504. This gain adjustment value is then supplied to the digital processing circuit 104 in step 506 which adjusts the amplitude of the formatted data 106 in order to adjust the signal strength provided by the transmission antenna 126.

Figure 6:
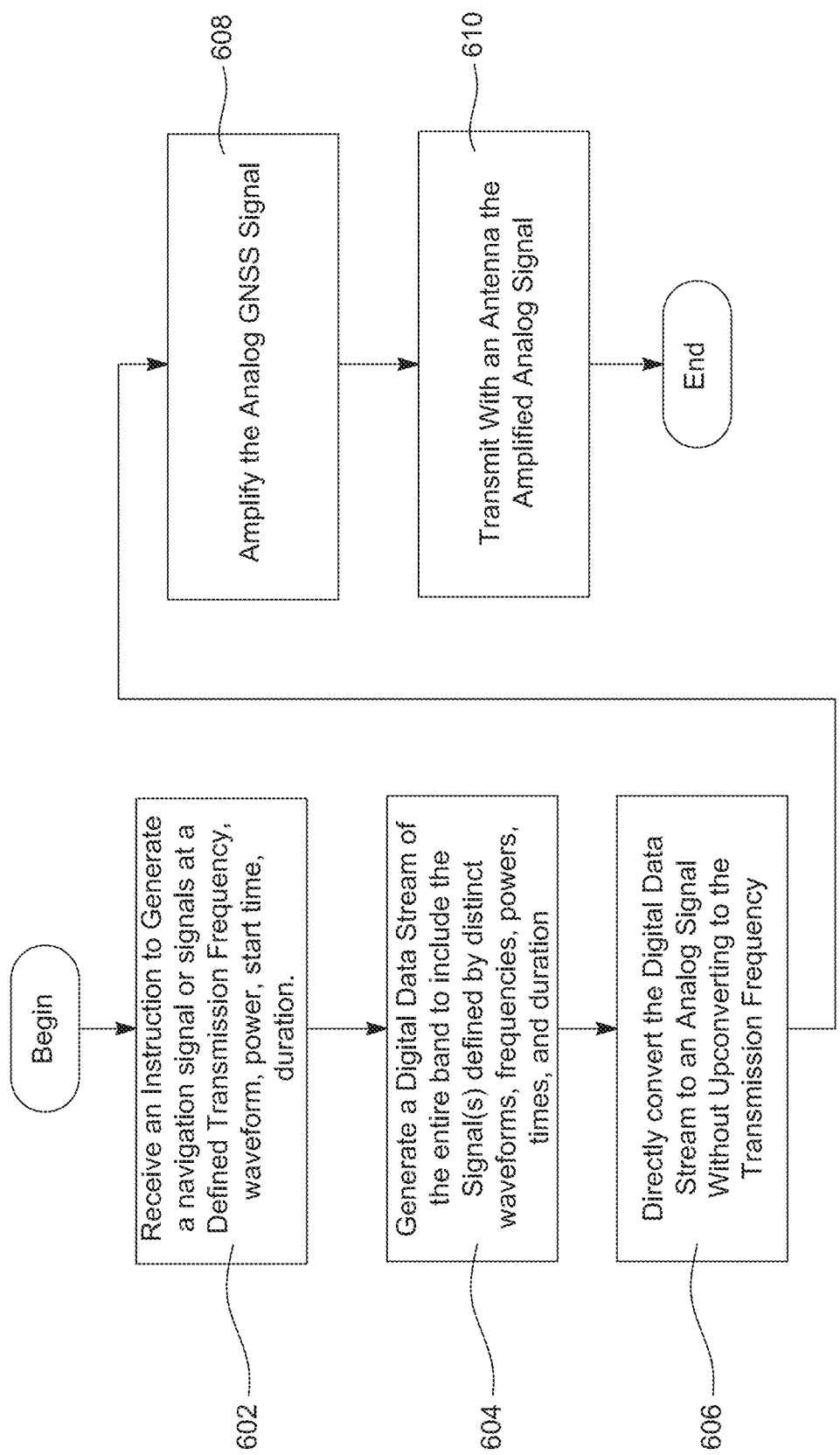
FIG. 6 is a flow chart listing the steps used to generate and transmit a navigation signal according to an exemplary embodiment.

FIG. 6 is a flow chart listing the steps used to receive an instruction to generate and transmit a data or navigation signal according to an exemplary embodiment. As illustrated in step 602, an instruction to generate a data or navigation signal—to include other instructions such as power, start time, and duration—is received by a digital processing circuit 104. In exemplary embodiments the instruction can be received from a PC, communications link, preprogrammed, or other method. In response to this instruction, the digital processing circuit 104 generates a digital data stream of one or more signals across the target band, e.g., the 1 GHz band between 1-2 GHz, in step 604. This digital data stream represents the data or navigation signals with the desired waveform, frequency, power, start time, and duration. In step 606, the digital data stream is converted to an RF analog signal that represents the desired band, e.g., 1 GHz band of signals. As noted, in an exemplary embodiment, no up conversion is performed on the analog signal; the analog signal is created directly at RF from the DAC for transmitted signal. In step 608, the analog signal is amplified and in step 610, the amplified analog signal is transmitted using an antenna.

In an exemplary embodiment, to eliminate noise present in a signal transmitted from an exemplary embodiment, a signal that corresponds to an inverse of the undesired noise signal is introduced into the digital signal. In certain exemplary embodiments this noise signals may result from factors such as FPGA timing and signal interleaving.

Figure 7:
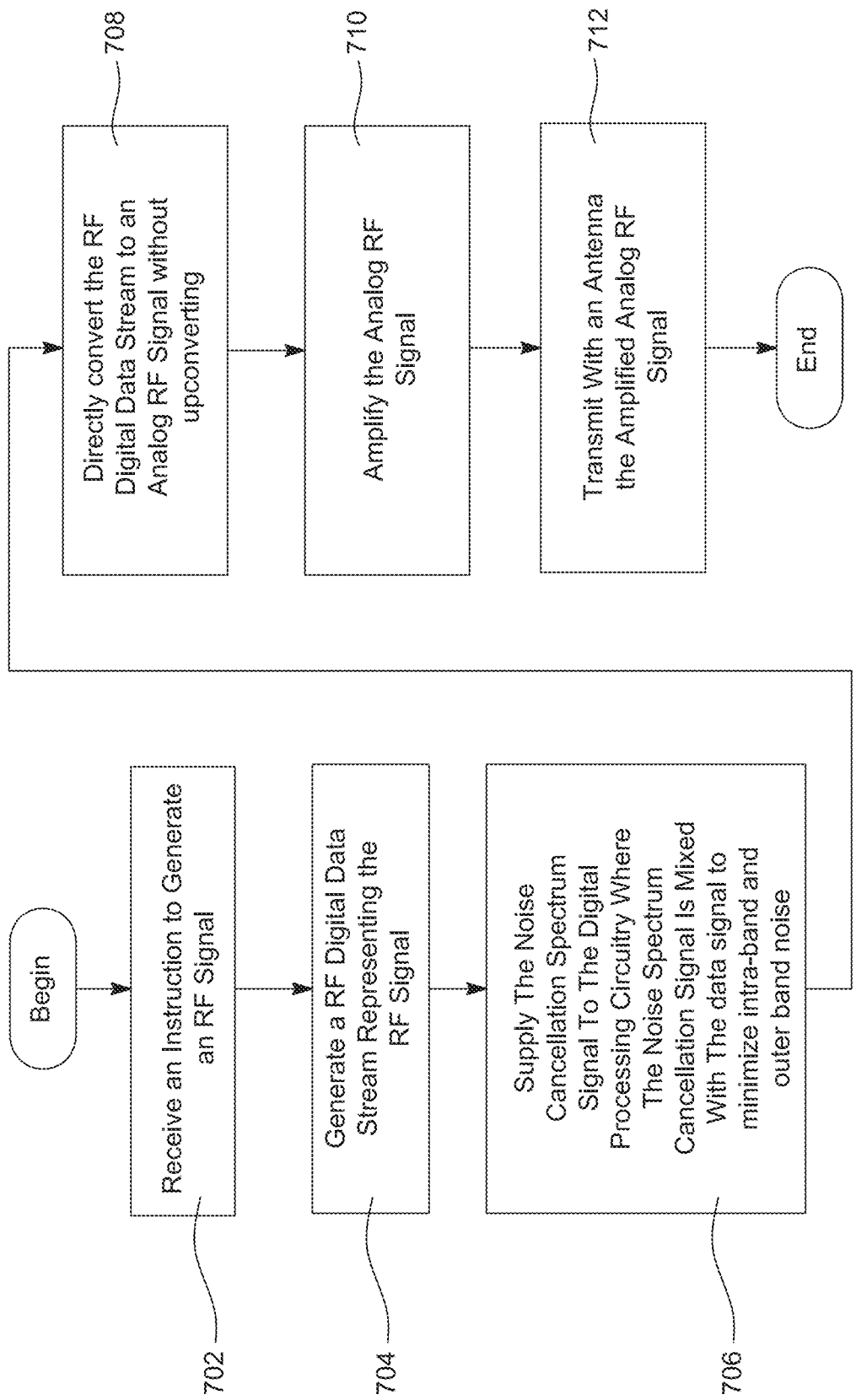
FIG. 7 is a flow chart listing the steps needed to generate and transmit a radio frequency signal according to an exemplary embodiment of the invention.

FIG. 7 is a flow chart listing the steps needed to generate and transmit a radio frequency signal according to an exemplary embodiment of the invention. As illustrated in FIG. 7, an instruction is provided to the digital processing circuit 104 in step 702. In step 704, a digital data stream is produced that represents an RF signal. In step 706, the noise cancellation signal for that portion of the band containing undesired noise is provided to the digital processing circuit 104. The digital processing circuit 104 combines the RF digital signal and the noise cancellation signal prior to digitization through DDS. This combined digitized signal is provided to the digital to analog converter 108 which converts the band, e.g., 1 GHz band, containing the digital RF signal to an analog RF signal in step 710. The amplified RF signal is then transmitted by an antenna in step 712.

In an exemplary embodiment, the amplifier used may be adjusted to optimize its amplification characteristics based on the frequency and signal bandwidth of the navigation signals to be amplified and transmitted. As is illustrated in FIG. 2, an instruction to generate RF signals is received in the form of signal data descriptors 102 is received by the FPGA 104. Data signal characteristic data 117 is provided to the amplifier 116. The digital processing circuit 104 generates the RF signals across the target band, e.g., the 1 GHz band between 1-2 GHz, and the signals are converted to an analog signal by a digital to analog converter 108. Via the data signal characteristic data 117, an amplifier 116 is informed where within the target band, e.g., the 1 GHz band between 1-2 GHz, the signal or signals reside. The amplifier 116 may then adjust its amplification characteristics to correspond to multiple pass bands of the RF signals transmitted on the selected center frequencies accounting for signal bandwidths. The amplifier then amplifies each RF signal within the larger band, e.g., 1 GHz band, and the entire amplified signal band, e.g., band of 1 GHz, is transmitted by an antenna 126.

Figure 8:
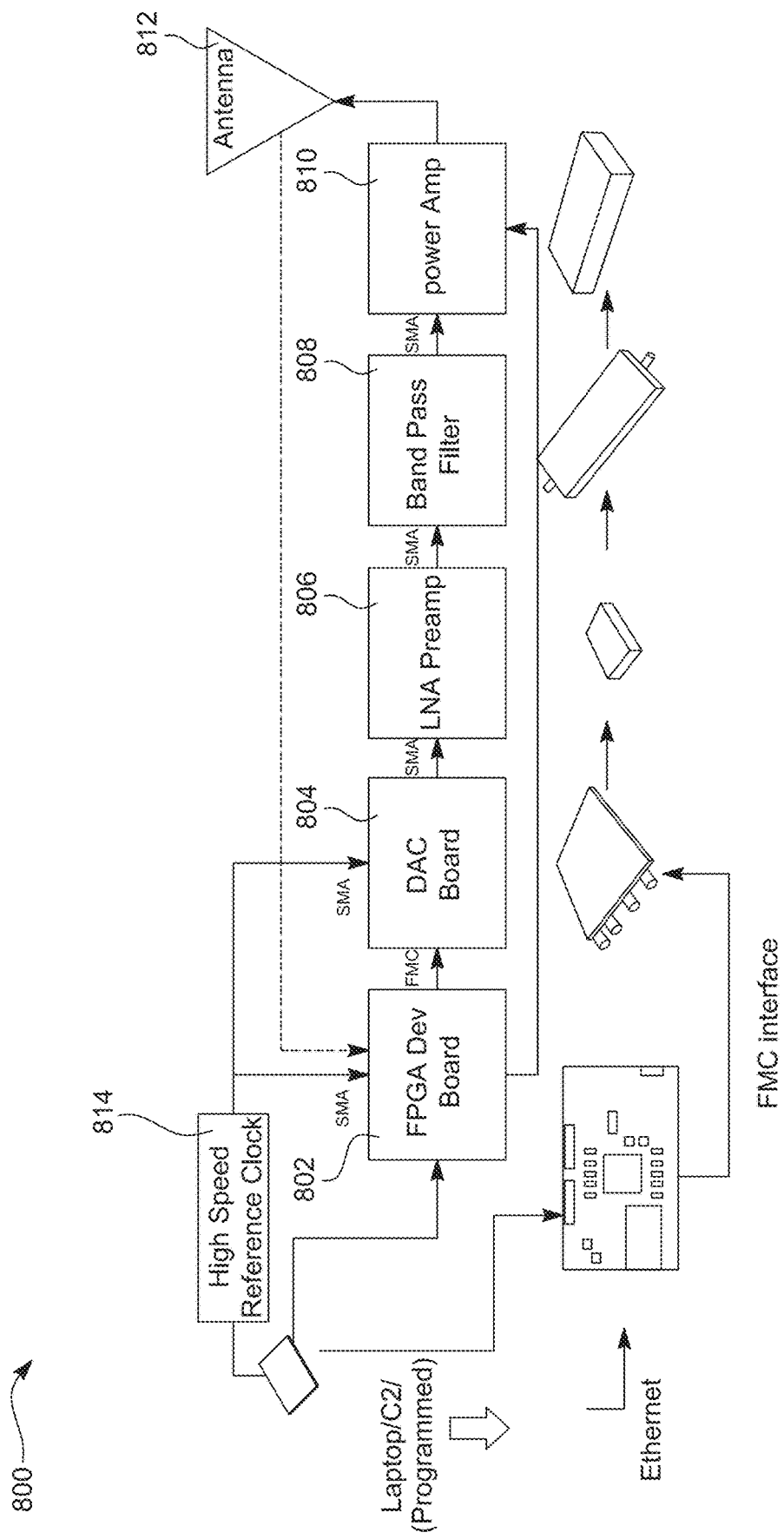
FIG. 8 is a schematic block diagram showing an exemplary embodiment in hardware.

FIG. 8 is a schematic block diagram showing an exemplary embodiment in hardware. Included in the diagram are illustrations of an exemplary FPGA board 802, a DAC board 804, a preamplifier 806, a band pass filter that may be fixed or adjustable in software according the certain embodiments 808, a power amplifier 810, and an antenna 812. Also illustrated is a reference clock 814 that supplies timing signals to the FPGA board, a DAC board.

Figure 9:
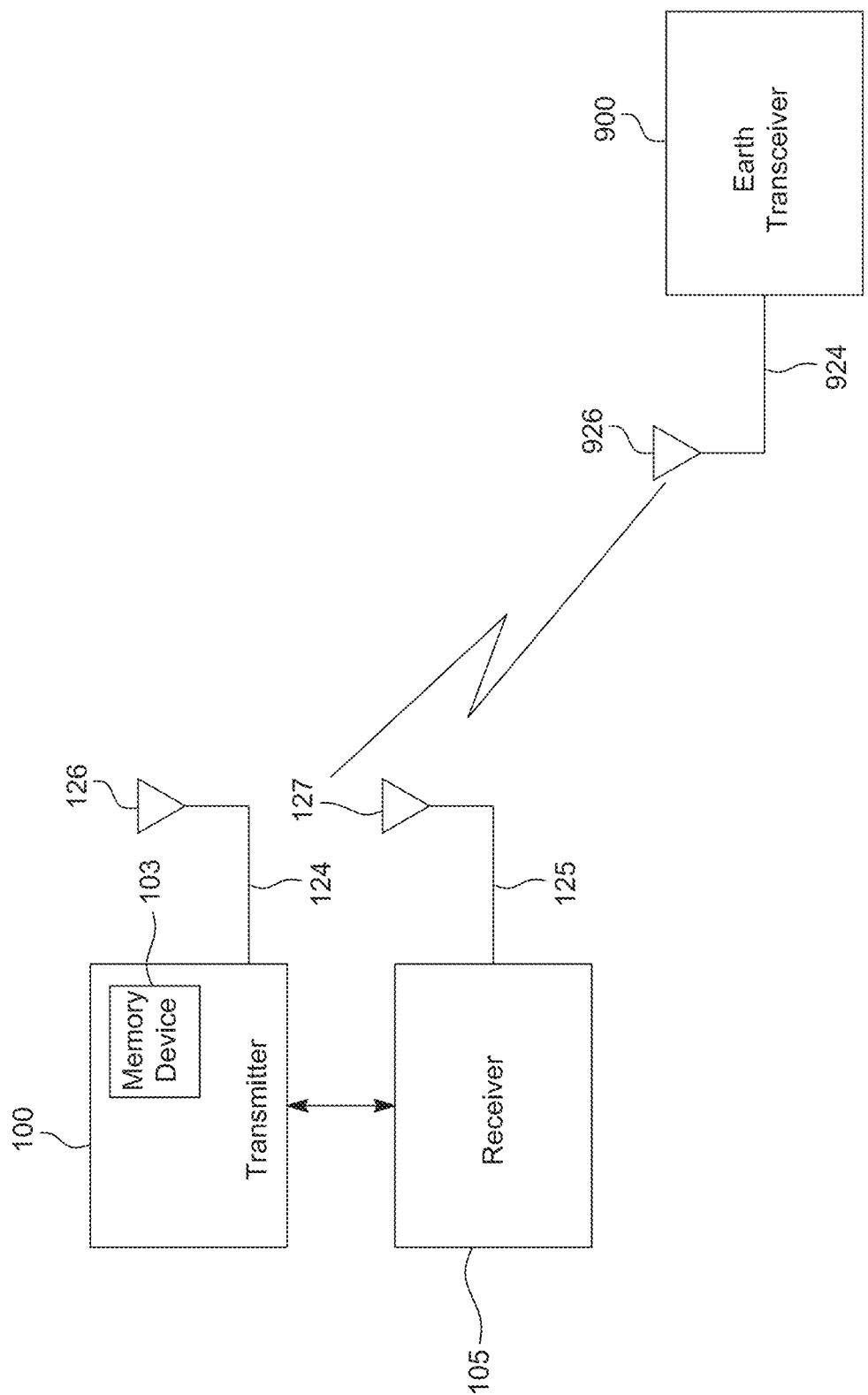
FIG. 9 is a functional block diagram showing an exemplary communication system for adding or programming new signal characteristics into the memory device of the ANTS system—either remotely or through wired communications—of FIG. 1.

FIG. 9 is a functional block diagram showing an exemplary communication system for adding or programming new signal characteristics into the memory device 103 of the ANTS (e.g., transmitter) system 100 of FIG. 1. As described above, the non-volatile memory 103 may physically reside within the signal data descriptor 102, within the digital processing circuit 104, within another structural unit of the transmitter 100, and/or may reside as a distinct structural unit on its own. Also as described above, the signal descriptor 102 specifies the signal characteristics to a digital processing circuit 104, which in turn generates one or more navigation signals for transmission from the position (e.g., location in space) of the transmitter 100 to one or more navigation receivers (not shown in this figure), e.g., on earth. The signal characteristics includes at least one of a carrier frequency (e.g., a center frequency and bandwidth), a waveform type, structure format of data (to be transmitted), modulation type(s), clock or timing information, transmitter position, and other information that may be desirable or necessary for a navigation receiver to determine its position based on signals received the transmitter 100.

As shown in FIG. 9, the communication system comprises the transmitter 100 (e.g., of FIG. 1) and a receiver 105 that is operationally connected to the transmitter 100, both of which communicate with an earth transceiver system 900. As described in FIG. 1, the transmitter 100 comprises many components that are not shown in this figure, but only the memory device 103, amplified signals 124, and RF antenna 126 are shown in this figure for convenience only. Also, as described in FIG. 1, the transmitter 100 is typically located at a predesignated position or orbit in space. In this embodiment, the receiver 105 comprises an RF receiver that is typically co-located with the transmitter 100 in space. The receiver 105 is configured to receive data and instructions from a remote transmitter system such as the transceiver 900, which may be located at a location on earth or elsewhere (e.g., in space). The receiver 105 communicates the data and instructions to the transmitter 100. For instance, when new signal characteristics are desired to be added to the navigation signal generation of the transmitter 100 (e.g., using its digital processing circuit 104), an operator of the earth transceiver 900 may initiate a transmission of instructions and data 924 describing such new signal characteristics from the transceiver 900 via its RF antenna 926 to the receiver 105 via its RF antenna 127 (or by sharing the same RF antenna 126 with the transmitter 100). Upon receipt of instructions and data 125, the receiver 105 is configured to route such received instructions and data 125 to the transmitter 100. A component of the transmitter 100, such as the above described controller 101, may coordinate the execution of such instructions and storage of such data into the memory device 103. Thus, the memory device 103 provides the ability to be re-programmed with new signal characteristics to accommodate a flexible navigation signal generation as the navigation requirements may change in the future. Being non-volatile, the memory device 103 is also able to maintain integrity of and ability to retrieve the signal characteristics after a loss of power to the transmission system.

As noted above, FIG. 10 shows a functional block diagram of an exemplary single tunable multi-band amplifier system in accordance with one embodiment of the invention. As described in connection with FIG. 1 above, amplifying analog signals can require one RF amplifier for each RF signal band. Thus, if multiple RF signal bands are to be amplified and filtered, multiple tunable bandpass filters for each signal and band can be fed as respective inputs to separate multiple tunable amplifiers. The number of tunable bandpass filters and amplifiers would be preselected and the number of individual signals capable of being transmitted across the band would be limited to the number of filter and amplifier pairs selected and implemented. In the following embodiment, it is desirable to reduce the weight and volume resulting from such a system of paired filters and amplifiers. An alternative embodiment provides a single multi-band power amplifier is shown in FIG. 10.

Figure 10:
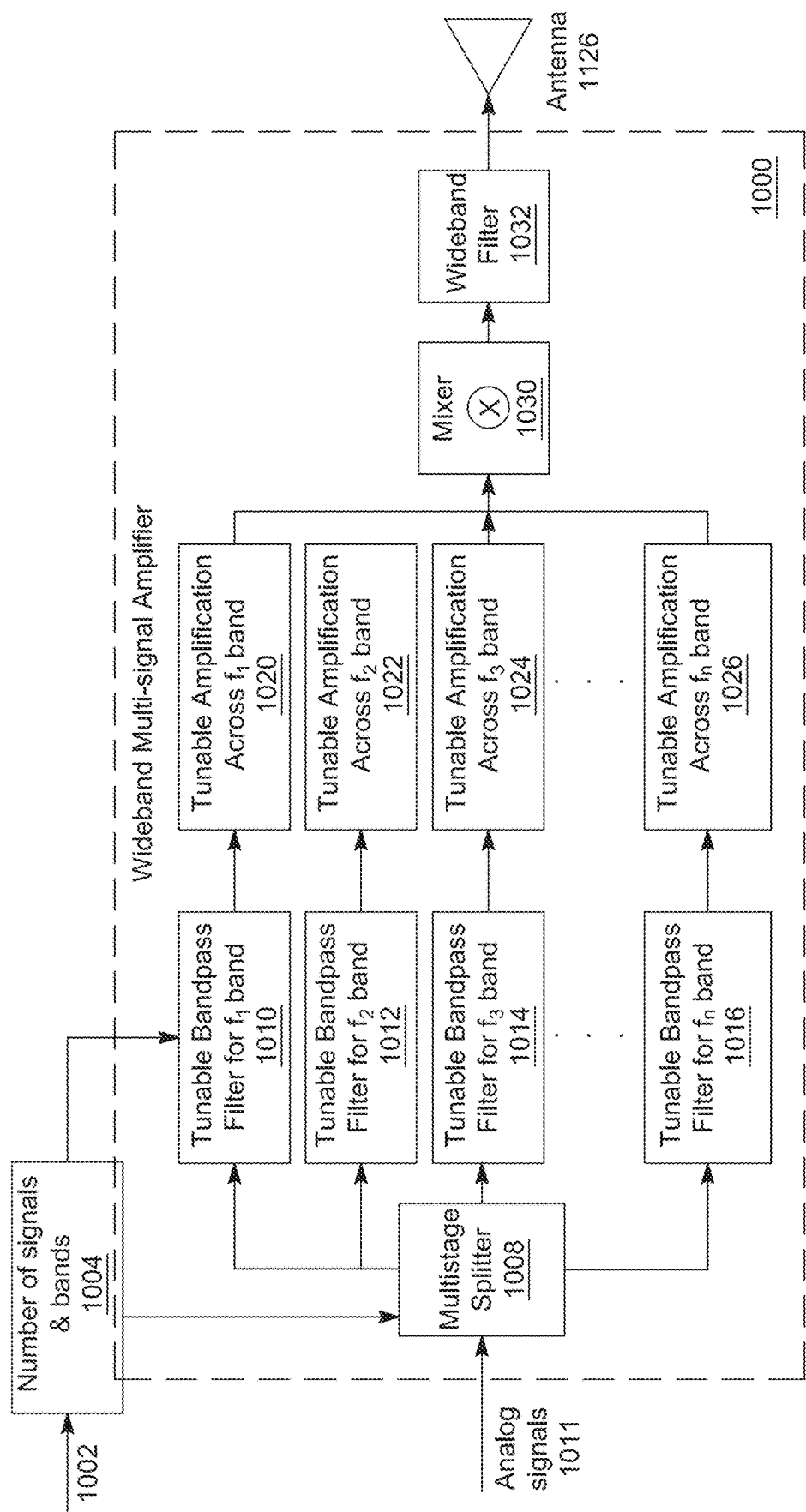
FIG. 10 shows a functional block diagram of an exemplary single tunable multi-band amplifier system in accordance with one embodiment of the invention.

In FIG. 10, a single tunable multi-band amplifier system 1000 is provided. As shown in FIG. 10, signal inputs 1002 are fed into a Number of Signals and Bands component 1004 to identify a count for the number of bands and bandwidth. Such signal inputs 1002 may be provided from another component in the transmitter system of FIG. 1A, such as a controller similar to the Controller 101 of FIG. 1A. In addition, and in this exemplary embodiment, one or more analog signals 1011 belonging to the complete 1 GHz spectrum of signals may be fed into a Multi-Stage Splitter 1008 of the amplifier system 1000. In this embodiment, it is desirable to amplify more than a single band of frequencies, while at the same time achieving a reduction in size and weight of the amplifier system 1000. The amplifier system 1000 comprises the Splitter 1008 that is configured to receive the analog signals 1011 from a previous stage in the signal processing, e.g., from a digital to analog converter (not shown in this figure) that is similar to the digital to analog converter shown in FIG. 1A. The Splitter 1008 is configured to pass on analog signals that are desired for filtering and amplification while excluding other signals that are not intended for further processing by the amplifier system 1000. In one embodiment, the Splitter 1008 may receive control information from the Number of Signals and Bands component 1004 identifying the number of signals and bands intended for filtering and amplification. The Splitter 1008 feeds incoming analog signals 1011 to respective tunable bandpass filters, e.g., Tunable Bandpass Filter for $f_1$ band ("Filter 1010"), Tunable Bandpass Filter for $f_2$ band ("Filter 1012"), Tunable Bandpass Filters for f3 ("Filter 1014") through Tunable Bandpass Filter for $f_n$ band ("Filter 1016"), where f is the center frequency of the bandpass filter and n is a positive integer number that reflects the total number of signals across the 1 GHz band. With this individualized bandpass filtering, amplification can be applied to only smaller bands (relative to the full 1 GHz band of the analog signals) that contain only the communications and/or navigation signals, whereas other spectrum frequencies remain at a quiescent noise level and are not amplified.

For example, for two analog signals of interest, e.g., n=2, the Splitter 1008 sends two analog signals 1011 and signal bands on to the first two stages $f_1$ and $f_2$ (i.e., bandpass filter and amplification) and all other stages are bypassed. After filtering, the analog signals 1011 that are intended for amplification are passed on to respective tunable amplification components, such as a Tunable Amplification Across f1 band 1020, a Tunable Amplification Across f2 band 1022, a Tunable Amplification Across f3 band 1024 through a Tunable Amplification Across $f_n$ band 1026, wherein, as noted above, f is the center frequency of the bandpass filter and n is a positive integer number that is greater or equal to 2. Each tunable amplifier is configured to amplify the (sub) band across its respective center frequency f, e.g., $f_1$, $f_2$ etc. As indicated in this embodiment above, frequencies outside the designated bands remain at a quiescent noise level and are not amplified. The outputs of the foregoing tunable amplifiers are fed into a Mixer 1030 that is configured to mix (e.g., combine) the outputs at their respective RF frequencies for transmission by an antenna 1126 (that is similar to the antenna 126 of FIG. 1A).

After the Mixer 1030, the mixed analog signals may be fed into a Wideband Filter 1032 that is configured to filter any noise or undesired signal levels in the mixed signals outside the intended transmission band, e.g., 1 GHz band, through the antenna 1126. It is worth noting that, as described in connection with FIG. 1A, the entire processing (e.g., filtering and amplification) of the analog signals 1011 occurs without the need for up-converting the analog signals to a higher frequency for transmission. Thus, with this amplifier system 1000, the system can advantageously achieve enhanced multiple filters and amplification stages with extremely low levels of noise in the intra-band regions to suppress amplifying out of signal-band noise. Finally, multiple signals can be transmitted within a much smaller size, weight, and power footprint since the single amplifier system described in this embodiment replaces the multiple amplifier system typically employed.

In other exemplary embodiments, the various systems and methods disclosed herein are used to create and transmit data and navigation signals that simulate actual GNSS satellite signals that are blocked by buildings to provide GNSS signals where satellite signals are blocked such as in urban environments. An exemplary application of other embodiments is in self-driving vehicles that need highly accurate position to maintain safety and navigation. Based upon detailed mapping and propagation signal modeling of urban-like environments, one or more ANTS systems are mounted on high structures to provide GNSS signal coverage when GNSS signals are blocked. As GNSS orbits are known, each ANTS system is preprogrammed based upon time of day and GNSS constellation type to broadcast the GNSS signals that are otherwise blocked.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more general purpose computers or processors. The code modules may be stored in any type of non-transitory computer-readable medium or other computer storage device. Some or all the methods may alternatively be embodied in specialized computer hardware. In addition, the components referred to herein may be implemented in hardware, software, firmware or a combination thereof. Moreover, in certain embodiments, acts or events can be performed concurrently, for example, through multi-threaded processing, interrupt processing, or multiple processors or processor cores or on other parallel architectures, rather than sequentially. In addition, different tasks or processes can be performed by different machines and/or computing systems that can function together.

The various illustrative logical blocks, modules, and algorithm elements described in connection with the embodiments disclosed herein can be implemented as electronic hardware, computer software, or combinations of both. To clearly illustrate this interchangeability of hardware and software, various illustrative components, blocks, modules, and elements have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein, e.g., functional block diagrams in FIGS. 1-5, can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable devices that performs logic operations without processing computer-executable instructions. A processor can also be implemented as a combination of computing devices, for example, a combination of a DSP and a microprocessor, a plurality of microprocessors, one or more microprocessors in conjunction with a DSP core, or any other such configuration. Although described herein primarily with respect to digital technology, a processor may also include primarily analog components. For example, some, or all, of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, or algorithm described in connection with the embodiments disclosed herein can be embodied directly in hardware, in a software module stored in one or more memory devices and executed by one or more processors, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile. The processor and the storage medium can reside in an ASIC. The ASIC can reside in a user terminal. In the alternative, the processor and the storage medium can reside as discrete components in a user terminal.

Conditional language such as, among others, "can," "could," "might" or "may," unless specifically stated otherwise, are otherwise understood within the context as used in general to convey that certain embodiments include, while other embodiments do not include, certain features, elements and/or blocks. Thus, such conditional language is not generally intended to imply that features, elements and/or blocks are in any way required for one or more embodiments or that one or more embodiments necessarily include logic for deciding, with or without user input or prompting, whether these features, elements and/or blocks are included or are to be performed in any particular embodiment.

Disjunctive language such as the phrase "at least one of X, Y, or Z," unless specifically stated otherwise, is otherwise understood with the context as used in general to present that an item, term, and so forth, may be either X, Y, or Z, or any combination thereof (for example, X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following.

What is claimed is:

1. A transmission system for providing navigation signals, the system comprising:
   a splitter circuit configured to receive a plurality of radio frequency (RF) signals oscillating at at least two different frequencies $f_1$ and $f_2$, and configured to split and forward the RF signals having the $f_1$ frequency to a first bandpass filter and the RF signals having the $f_2$ frequency to a second bandpass filter;
   a first tunable amplifier configured to receive the RF signals from the first bandpass filter;
   a second tunable amplifier configured to receive the RF signals from the second bandpass filter at substantially the same time as the first tunable amplifier's receipt of the RF signals from the first bandpass filter; and
   a digital processing circuit configured to generate the RF signals in digital form based on pre-stored signal characteristics specifying a plurality of navigation signals,
   wherein the first tunable amplifier is further configured to amplify its RF signals across a first band centered around the frequency $f_1$, and the second tunable amplifier is further configured to amplify its RF signals across a second band centered around the frequency $f_2$, and the amplified RF signals are fed substantially concurrently into a mixer circuit for transmission via an RF antenna to a navigation receiver.

2. The transmission system of claim 1, wherein the first and second tunable amplifiers amplify the RF signals without an up-conversion to a higher frequency prior to transmission via the RF antenna.

3. The transmission system of claim 1, further comprising the mixer circuit and the mixer circuit is configured to mix and feed the RF signals into the RF antenna without an up-conversion to a higher frequency prior to transmission via the RF antenna.

4. The transmission system of claim 1, wherein the tunable bandpass filters and tunable amplifiers are integrated into a single amplifier circuit.

5. The transmission system of claim 1, wherein the RF signals are in analog form suitable for transmission over the RF antenna.

6. The transmission system of claim 1, further comprising a controller component configured to provide the number of RF signals "n" and bands to the splitter circuit, wherein "n" is greater or equal to 2.

7. The transmission system of claim 1, further comprising a non-volatile memory device configured to store the signal characteristics at time of manufacturing of the transmission system and maintain integrity of and ability to retrieve the signal characteristics after a loss of power to the transmission system.

8. The transmission system of claim 1, further comprising a wideband filter configured to receive and filter the amplified RF signals prior to delivery to the RF antenna.

9. The transmission system of claim 1, further comprising a reference timing source and ephemeris reference source in communication with a digital processing circuit that generates the RF signals.

10. The transmission system of claim 1, further comprising the first and second bandpass filters, wherein the first bandpass filter is tunable for a band surrounding the frequency $f_1$ and the second bandpass filter is tunable for a band surrounding the frequency $f_2$.

11. A method of amplifying and providing navigation signals to a navigation receiver, the method comprising:
   receiving a plurality of radio frequency (RF) signals oscillating at at least two different frequencies $f_1$ and $f_2$;
   splitting and forwarding the RF signals having the $f_1$ frequency to a first bandpass filter and the RF signals having the $f_2$ frequency to a second bandpass filter;
   receiving the RF signals from the first bandpass filter;
   receiving the RF signals from the second bandpass filter at substantially the same time as the first tunable amplifier's receipt of the RF signals from the first bandpass filter;
   amplifying by a first tunable amplifier the RF signals received from the first bandpass filter across a first band centered around the frequency $f_1$;
   amplifying by a second tunable amplifier the RF signals received from the second bandpass filter across a second band centered around the frequency $f_2$;
   feeding the amplified RF signals substantially concurrently into a mixer circuit for transmission via an RF antenna to the navigation receiver; and
   generating the RF signals by a digital processing circuit in digital form based on pre-stored signal characteristics specifying a plurality of navigation signals.

12. The method of claim 11, wherein feeding the RF signals into the mixer circuit comprises maintaining the RF signals at substantially the same frequencies $f_1$ and $f_2$ without an up-conversion to a higher frequency prior to transmission via the RF antenna.

13. The method of claim 11, further comprising mixing and feeding the RF signals into the RF antenna without an up-conversion to a higher frequency prior to transmission via the RF antenna.

14. The method of claim 11, wherein the tunable bandpass filters and tunable amplifiers are integrated into a single amplifier circuit.

15. The method of claim 11, wherein the RF signals are and remain in analog form suitable for transmission over the RF antenna during splitting and amplification.

16. The method of claim 11, further comprising providing the number of RF signals "n" and bands to a splitter circuit that is configured to perform splitting and forwarding of the RF signals, wherein "n" is greater or equal to 2.

17. The method of claim 11, further comprising storing in a non-volatile memory device the signal characteristics at time of manufacturing to maintain integrity of and ability to retrieve the signal characteristics after a loss of power.

18. The method of claim 11, further comprising filtering with a wideband filter the amplified RF signals prior to delivery to the RF antenna.

19. A transmission system for providing navigation signals, the system comprising:
- a splitter circuit configured to receive a plurality of radio frequency (RF) signals oscillating at at least two different frequencies $f_1$ and $f_2$, and configured to split and forward the RF signals having the $f_1$ frequency to a first bandpass filter and the RF signals having the $f_2$ frequency to a second bandpass filter;
- a first tunable amplifier configured to receive the RF signals from the first bandpass filter;
- a second tunable amplifier configured to receive the RF signals from the second bandpass filter at substantially the same time as the first tunable amplifier's receipt of the RF signals from the first bandpass filter; and
- a reference timing source and ephemeris reference source in communication with a digital processing circuit that generates the RF signals,
- wherein the first tunable amplifier is further configured to amplify its RF signals across a first band centered around the frequency $f_1$, and the second tunable amplifier is further configured to amplify its RF signals across a second band centered around the frequency $f_2$, and the amplified RF signals are fed substantially concurrently into a mixer circuit for transmission via an RF antenna to a navigation receiver.

\* \* \* \* \*

UNITED STATES PATENT AND TRADEMARK OFFICE
CERTIFICATE OF CORRECTION

PATENT NO. : 11,496,177 B2
APPLICATION NO. : 16/917445
DATED : November 8, 2022
INVENTOR(S) : Gerten et al.

It is certified that error appears in the above-identified patent and that said Letters Patent is hereby corrected as shown below:

In the Drawings

Sheet 6 of 11, Line 8, Delete "Nulllfy" and insert -- Nullify --.

In the Specification

Column 1, Line 5, please insert as a new paragraph, -- This invention was made with Government support under Contract FA9453-18-C-0273 awarded by the United States Air Force. The Government has certain rights in the invention. --.

Column 8, Line 3, Delete "Xylinx" and insert -- Xilinx --.

Signed and Sealed this
Seventeenth Day of January, 2023

Katherine Kelly Vidal
*Director of the United States Patent and Trademark Office*